United States Patent
Otsuka et al.

(10) Patent No.: US 6,541,405 B1
(45) Date of Patent: Apr. 1, 2003

(54) SYNTHETIC QUARTZ GLASS MEMBER FOR EXCIMER LASER AND METHOD OF MAKING

(75) Inventors: Hisatoshi Otsuka, Nakakubiki-gun (JP); Kazuo Shirota, Nakakubiki-gun (JP); Akira Fujinoki, Koriyama (JP)

(73) Assignees: Shin-Etsu Chemical Co., Ltd., Tokyo (JP); Shin-Etsu Quartz Products Co. Ltd., Tokyo (JP)

(*) Notice: Subject to any disclaimer, the term of this patent is extended or adjusted under 35 U.S.C. 154(b) by 202 days.

(21) Appl. No.: 09/610,860

(22) Filed: Jul. 6, 2000

(30) Foreign Application Priority Data

Jul. 7, 1999 (JP) .............................. 11-193353

(51) Int. Cl.$^7$ .............................. C03B 19/09; C03C 3/06
(52) U.S. Cl. .............................. 501/54; 65/17.3
(58) Field of Search .............................. 501/54; 65/17.1, 65/17.3

(56) References Cited

U.S. PATENT DOCUMENTS

| | | |
|---|---|---|
| 4,038,370 A | 7/1977 | Tokimoto |
| 6,143,676 A * | 11/2000 | Ohashi et al. ................ 501/54 |

FOREIGN PATENT DOCUMENTS

| | | |
|---|---|---|
| EP | 401 845 A | 12/1990 |
| EP | 622 340 A | 11/1994 |
| EP | 870 737 A | 10/1998 |
| EP | 878 451 A | 11/1998 |
| EP | 978 487 A | 2/2000 |
| EP | 1 016 635 A | 7/2000 |
| EP | 1 035 078 A | 9/2000 |
| EP | 1 063 203 A | 12/2000 |

OTHER PUBLICATIONS

Patent abstracts of Japan voll. 16, No. 126, Mar. 31, 1992 & JP 3–290330 (Dec. 20, 1991).

Patent abstracts of Japan, vol. 16, No. 98, Mar. 11, 1992 and JP 3–279231 Dec. 10, 1991.

* cited by examiner

*Primary Examiner*—Christopher A. Fiorilla
(74) *Attorney, Agent, or Firm*—Millen, White, Zelano & Branigan, P.C.

(57) ABSTRACT

A synthetic quartz glass member having (i) a change of transmittance at 193 nm of up to 0.002 cm$^{-1}$ as expressed in extinction coefficient when $4 \times 10^4$ shots of ArF excimer laser light are irradiated at 2 mJ/cm$^2$/pulse, (ii) an initial transmittance of at least 99.6% at 193 nm, (iii) a hydrogen molecule content of at least $5 \times 10^{17}$ molecules/cm$^3$, (iv) a refractive index amplitude of up to $1 \times 10^{-6}$, and (v) a birefringence of up to 1 nm/cm finds use in an excimer laser because it experiences a minimized change of light transmittance.

20 Claims, 2 Drawing Sheets

Ar O₂ O₂ H₂ H₂ O₂
(5) (6) (8) (9) (10) (11)

EXTINCTION COEFFICIENT AT 193nm
VERSUS MIXING RATIO OF REACTANT
TO OXYGEN AT BURNER CENTER

SYNTHETIC QUARTZ GLASS MEMBER FOR EXCIMER LASER AND METHOD OF MAKING

This invention relates to a synthetic quartz glass member for excimer lasers, and more particularly, to a synthetic quartz glass member having a minimal change of light transmittance and useful as optical parts such as lenses, prisms, mirrors, and windows in excimer lasers, especially ArF excimer lasers, and substrate materials in photomasks. It also relates to a method of preparing such a synthetic quartz glass member.

BACKGROUND OF THE INVENTION

To meet the recent trend of LSI toward higher integration, the photolithography of defining an integrated circuit pattern on a wafer requires an image exposure technique on the order of submicron units. For finer line width imaging, efforts have been made to reduce the wavelength of a light source of the exposure system. Then, the stepper lens for lithography, for example, is required to have excellent homogeneity and UV transmittance, and high resistance to UV irradiation.

From such a standpoint, synthetic quartz glass having a minimal content of impurities is used. In order to avoid contamination with metal impurities which cause UV absorption, the synthesis of quartz glass is generally carried out by introducing the vapor of a high purity silicon compound such as silicon tetrachloride directly into an oxyhydrogen flame. Flame hydrolysis takes place to form silica fines, which are directly deposited on a rotating heat-resistant substrate such as quartz glass and fusion vitrified thereon. In this way, transparent synthetic quartz glass is produced.

The transparent synthetic quartz glass thus produced exhibits satisfactory light transmittance in the short-wavelength range down to about 190 nm. It has been utilized as materials capable of transmitting UV laser light, specifically i-line and excimer laser light such as KrF (248 nm), XeCl (308 nm), XeBr (282 nm), XeF (351 and 353 nm) and ArF (193 nm), and the four-fold high harmonic wave (250 nm) of YAG.

The absorption of light in the UV region newly created by irradiating synthetic quartz glass with UV light having great energy as emitted by an excimer laser is deemed to be due to the paramagnetic defects formed through optical reaction from intrinsic defects in synthetic quartz glass. Many light absorption bands due to such paramagnetic defects have been identified by ESR spectroscopy, for example, as E' center (Si·) and NBOHC (Si—O·).

The paramagnetic defects generally have an optical absorption band. When UV light is irradiated to quartz glass, the problematic absorption bands in the UV region due to paramagnetic defects in quartz glass are, for example, at 215 nm due to E' center (Si·) and 260 nm, which has not been accurately identified. These absorption bands are relatively broad and sometimes entail outstanding absorption. This is a serious problem when quartz glass is used as a transmitting material for ArF and KrF excimer lasers.

Intrinsic defects in synthetic quartz glass which cause paramagnetic defects arise from structures other than $SiO_2$ such as Si—OH and Si—Cl and oxygen-depleted or enriched structures such as Si—Si and Si—O—O—Si.

As the approach for suppressing paramagnetic defects, it is proposed in JP-A 6-199532 to use a chlorine-free alkoxysilane such as tetramethoxysilane as the silane compound for preventing Si—Cl, one of paramagnetic defects, from being incorporated in glass.

It is also effective to utilize the phenomenon that synthetic quartz glass, when irradiated by an ArF laser, experiences an abrupt drop of transmittance at about $1\times10^4$ shots in an initial stage, but as irradiation continues, recovers the transmittance at about $1\times10^6$ shots. This phenomenon arise from a hydrogen concentration in the glass. The drop of transmittance at the initial stage of laser irradiation is greater with a higher hydrogen molecule concentration, but less with a lower hydrogen molecule concentration. The phenomenon is inverse in the case of long-term irradiation, that is, the drop of transmittance during long-term laser irradiation is less with a higher hydrogen molecule concentration, but greater with a lower hydrogen molecule concentration. This is presumed to be in accord with the following formula (4) or (5) as described in JP-A 7-43891.

Initial stage of irradiation

$$\text{Si—H} + h\nu \rightarrow \text{Si·} + \text{H} \qquad (4)$$

Recovery

$$\text{Si·} + \text{H} \rightarrow \text{Si—H} \qquad (5)$$

It is also proposed in JP-A 6-305736 to control the hydrogen molecule concentration in synthetic quartz glass. Depending on the energy using conditions of an ArF laser, the hydrogen molecular concentration in glass is adjusted. However, the adjustment of only the hydrogen molecule concentration is still not sufficient to suppress a change of transmittance, leaving a practical problem.

SUMMARY OF THE INVENTION

An object of the invention is to provide a synthetic quartz glass member for excimer lasers, having minimized the change of light transmittance in the UV region caused by irradiation of intense UV, and a method for preparing the same.

It has been found that when a synthetic quartz glass having a change of transmittance at wavelength 193 nm of up to 0.002 $cm^{-1}$ as expressed in extinction coefficient when $4\times10^4$ shots of ArF excimer laser light are irradiated at 2 $mJ/cm^2$/pulse, an initial transmittance of at least 99.6% at 193 nm, a hydrogen molecule content of at least $5\times10^{17}$ molecules/$cm^3$, a refractive index amplitude of up to $1\times10^{-6}$, and a birefringence of up to 1 nm/cm is used as a synthetic quartz glass member for an excimer laser, especially as a synthetic quartz glass member for an ArF excimer laser or a synthetic quartz glass member for a photomask, the change of light transmittance in the UV region caused by irradiation of intense UV is restrained.

In a first aspect, the invention provides a synthetic quartz glass member for an excimer laser, having (i) a change of transmittance at wavelength 193 nm of up to 0.002 $cm^{-1}$ as expressed in extinction coefficient when $4\times10^4$ shots of ArF excimer laser light are irradiated at 2 $mJ/cm^2$/pulse, (ii) an initial transmittance of at least 99.6% at 193 nm, (iii) a hydrogen molecule content of at least $5\times10^{17}$ molecules/$cm^3$, (iv) a refractive index amplitude of up to $1\times10^{-6}$, and (v) a birefringence of up to 1 nm/cm.

Typically the synthetic quartz glass member is for use in an ArF excimer laser. Also it is preferably used as a substrate for photomask.

In a second aspect, the invention provides a method for preparing the synthetic quartz glass member, comprising the step of feeding a mixture of an organic silicon compound and oxygen into a central nozzle of a burner for effecting decomposition of the organic silicon compound with an oxyhydrogen flame to synthesize quartz glass, the mixing ratio of the organic silicon compound to oxygen being at least two fold moles of the theoretical amount of oxygen. In another embodiment, the method further involves the step of annealing the resulting synthetic quartz glass member. In a further embodiment, the method further involves the steps of homogenizing and then annealing the resulting synthetic quartz glass member.

DESCRIPTION OF THE PREFERRED EMBODIMENT

Figure 1:
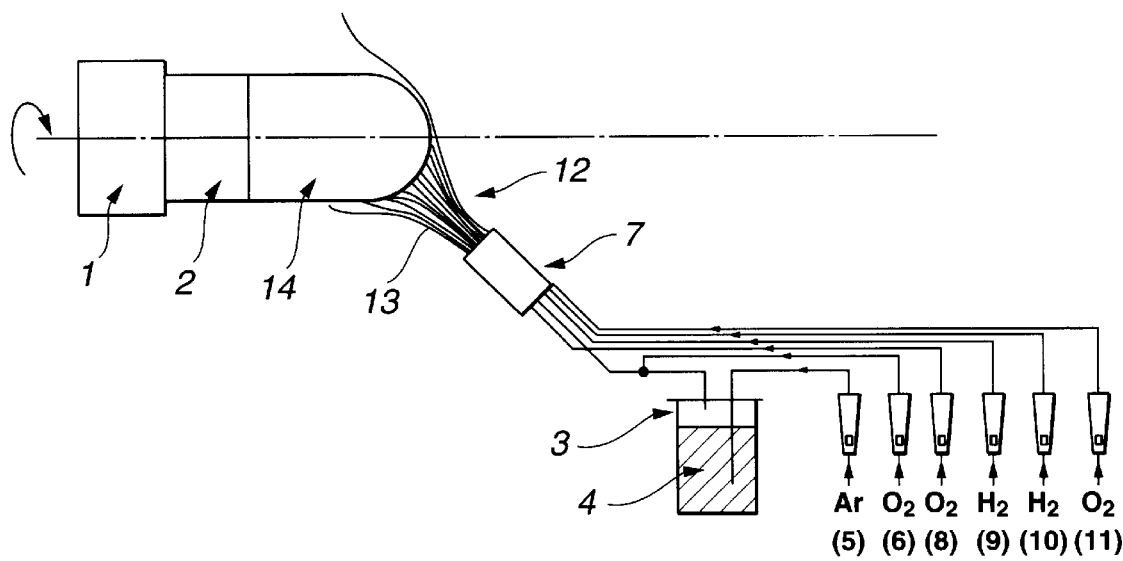
FIG. 1 is a schematic view of one exemplary apparatus for preparing synthetic quartz glass.

The synthetic quartz glass member for an excimer laser according to the invention experiences a change of transmittance at wavelength 193 nm of up to 0.002 cm$^{-1}$, preferably up to 0.0015 cm$^{-1}$, as expressed in extinction coefficient when ArF excimer laser light is irradiated at 2 mJ/cm$^2$/pulse and $4 \times 10^4$ shots. When a synthetic quartz glass member with a greater transmittance change beyond the level is used as a lens member in a stepper for transferring a circuit pattern, the image can be distorted by thermal aberration concomitant with absorption.

The synthetic quartz glass member has an initial transmittance of at least 99.6%, preferably at least 99.7% at 193 nm. A lower initial transmittance below the level raises a similar problem to the above.

The synthetic quartz glass member has a hydrogen molecule content of at least $5 \times 10^{17}$ molecules/cm$^3$, preferably at least $10 \times 10^{17}$ molecules/cm$^3$. If the hydrogen molecule content is less than $5 \times 10^{17}$ molecules/cm$^3$, the synthetic quartz glass member will experience a change of transmittance in excess of 0.002 cm$^{-1}$ as expressed in extinction coefficient upon long-term laser irradiation. The upper limit of the hydrogen molecule content is not critical although it is usually up to $1 \times 10^{19}$ molecules/cm$^3$. It is recommended to adjust the hydrogen molecule content within the indicated range in order to restrain a change of transmittance upon long-term laser irradiation.

The synthetic quartz glass member has a refractive index amplitude of up to $1 \times 10^{-6}$, preferably up to $0.5 \times 10^{-6}$, and a birefringence of up to 1 nm/cm. With a refractive index amplitude and a birefringence beyond the indicated levels, when a synthetic quartz glass member is used as a lens member in a stepper for transferring a circuit pattern, the transferred image can be distorted.

The terms used herein are defined as follows. When a synthetic quartz glass plate of 10 mm thick having a pair of major surfaces polished is irradiated with light from an ArF excimer laser under conditions: an energy density of 2 mJ/cm$^2$/pulse, 200 Hz and $4 \times 10^4$ shots, the term "change of transmittance" is the maximum of the difference between an extinction coefficient at 193 nm concomitant with the absorption at 215 nm induced in the synthetic quartz glass and an extinction coefficient at 193 nm prior to irradiation.

The term "initial transmittance" is an internal transmittance of synthetic quartz glass which has not been irradiated with excimer laser light. The internal transmittance (Ti) is the apparent transmittance of a synthetic quartz glass plate of 10 mm thick having a pair of major surfaces polished as measured by a UV spectrometer divided by the theoretical transmittance. Provided that Ta is an apparent transmittance at wavelength 193 nm, the internal transmittance is calculated according to Ti=Ta/90.85. The "extinction coefficient" at wavelength 193 nm is expressed by $-\log$Ti. The "refractive index amplitude" is the difference ($\Delta n$) between the minimum and the maximum of the refractive index at wavelength 632.8 nm of a synthetic quartz glass plate of 50 mm thick.

Now, it is described how to prepare a synthetic quartz glass member according to the invention. The method starts with an organic silicon compound which is preferably selected from silane compounds and siloxane compounds represented by the following general formulae (1), (2) and (3).

(1)

Herein R$^1$ and R$^2$, which may be the same or different, are monovalent aliphatic hydrocarbon groups and n is an integer of 0 to 3.

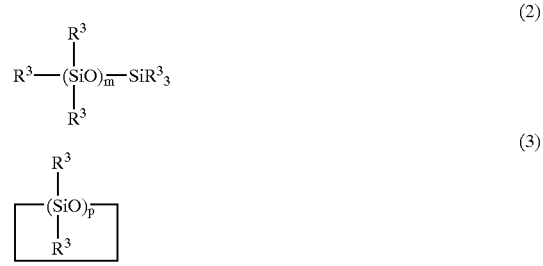

Herein R$^3$ is hydrogen or a monovalent aliphatic hydrocarbon group, m is an integer of at least 1, especially 1 or 2, and p is an integer of 3 to 5.

Examples of the monovalent aliphatic hydrocarbon groups represented by R$^1$, R$^2$ and R$^3$ include alkyl groups of 1 to 4 carbon atoms, such as methyl, ethyl, propyl, n-butyl and tert-butyl, cycloalkyl groups of 3 to 6 carbon atoms such as cyclohexyl, and alkenyl groups of 2 to 4 carbon atoms such as vinyl and allyl.

Examples of the silane compound represented by formula (1) include Si(OCH$_3$)$_4$, Si(OCH$_2$CH$_3$)$_4$, and CH$_3$Si(OCH$_3$)$_3$. Examples of the siloxane compound represented by formulae (2) and (3) include hexamethyldisiloxane, hexamethylcyclotrisiloxane, octamethylcyclotetrasiloxane, and decamethyl-cyclopentasiloxane.

The reactant (e.g., silane or siloxane compound), a combustible gas (e.g., hydrogen, carbon monoxide, methane or propane) and a combustion-sustaining gas (e.g., oxygen) are fed to a quartz burner for forming an oxyhydrogen flame with which the reactant undergo flame hydrolysis to form silica fines. According to the invention, the mixing ratio of the silane or siloxane compound to oxygen is set to be at least two fold moles of the theoretical amount of oxygen, thereby restraining the formation of structural defects which can be generated upon irradiation of high energy laser light from an excimer laser, especially ArF excimer laser and the absorption caused by E' center (Si.) having an absorption band at wavelength 215 nm.

An apparatus for producing a synthetic quartz glass member may be of either vertical or lateral type. When the lateral apparatus is used, the mixing ratio of the silane or siloxane compound to oxygen is preferably at least two fold moles, especially 2.5 to 3.0 fold moles of the theoretical amount of oxygen.

For the vertical apparatus which is easy to produce a synthetic quartz glass member having a large diameter of 200 mm or greater owing to the application of a self weight, the burner nozzle has a large diameter and then, the mixing ratio of the silane or siloxane compound to oxygen fed to the nozzle at the center of the burner is preferably at least three fold moles, especially 3.5 to 4.0 fold moles of the theoretical amount of oxygen.

If the mixing ratio of the silane or siloxane compound to oxygen is less than two fold moles, the extinction coefficient at wavelength 215 nm exceeds 0.003 cm$^{-1}$, and the change of transmittance at 193 nm exceeds 0.002 cm$^{-1}$.

The molar ratio of the actual amount of oxygen to the theoretical amount of oxygen required by the silane or siloxane compound and hydrogen fed to the burner is preferably set in the range from 0.6 to 1.3, and especially from 0.7 to 0.9. This setting enables the synthetic quart glass member to maintain a hydrogen molecule content of at least $5\times10^{17}$ molecules/cm$^3$, and thus maintain long-term stability (to suppress a change of transmittance) upon excimer laser light irradiation. If the above ratio is below 0.6, the temperature of the surface on which silica fine particles are deposited and fused lowers to disturb silica growth, allowing the extinction coefficient at wavelength 215 nm at the initial stage of laser light irradiation to exceed 0.003 cm$^{-1}$, and as a result, the change of transmittance at wavelength 193 nm will exceed 0.002 cm$^{-1}$ as expressed in extinction coefficient. If the above ratio is above 1.3, the hydrogen molecule content is less than $5\times10^{17}$ molecules/cm$^3$, failing to maintain long-term stability upon excimer laser light irradiation.

The burner to which the silane compound, a combustible gas such as hydrogen, and a combustion-sustaining gas such as oxygen are fed may have a multiple tube at the center as usual. Especially, a triple or quintuple tube burner is used.

The synthetic quartz glass member for an excimer laser, produced by the above-described method, may have an extinction coefficient at wavelength 215 nm of up to 0.003 cm$^{-1}$ after it is irradiated with an ArF excimer laser light under conditions: an energy density of 2 mJ/cm$^2$/pulse, 200 Hz and $4\times10^4$ shots. The change of transmittance at wavelength 193 nm can be suppressed to 0.002 cm$^{-1}$ or less as expressed in extinction coefficient. Since the absorption band at wavelength 215 nm has a skirt covering the region of wavelength 193 nm, the change of transmittance is correlated thereto. It is noted that since analysis of absorption spectrum indicates that the extinction coefficient at 193 nm is about 60% of the extinction coefficient at 215 nm, the former can be determined by multiplying the extinction coefficient at 215 nm by 0.6.

The synthetic quartz glass member produced is preferably annealed. Annealing is effected by heating in vacuum or in an inert gas atmosphere such as argon gas or helium gas to a temperature of at least 1,500° C., preferably at least 1,800° C. for thereby shaping the member to a desired shape. The shape is then heated at 1,100 to 1,250° C., preferably 1,150 to 1,200° C. and slowly cooled at a cooling rate of 0.1° C./min or less down to a temperature of 600° C. This results in an optically highly homogeneous synthetic quartz glass member for use in an excimer laser.

In the method of preparing a synthetic quartz glass member for an excimer laser according to the invention, homogenization is effected if necessary. In the case of the vertical apparatus which is easy to produce a synthetic quartz glass member having a large diameter of 200 mm or greater, the resulting ingot has a large diameter so that the silica growing on the fusion front has a reduced thickness per layer. The resulting ingot is optically homogeneous, eliminating a need for homogenization. The ingot prepared using the lateral apparatus is preferably subjected to homogenization. Homogenization is effected by applying shearing force to the synthetic quartz glass member at a temperature of at least 1,600° C., preferably at least 1,700° C. The resulting synthetic quartz glass is highly homogeneous in that it has no striae in three directions.

The synthetic quartz glass member of the invention is useful as optical parts such as lenses in an exposure system of a stepper, lenses for projection optics, windows, mirrors, beam splitters, and prisms, and glass substrates for photomasks such as reticle substrates.

EXAMPLE

Examples of the invention are given below by way of illustration and not by way of limitation.

Example 1

Methyltrimethoxysilane as a reactant was fed to a quartz burner where it was oxidized or combustion decomposed with an oxyhydrogen flame to form silica fine particles, which were deposited on a rotating quartz target and fusion vitrified at the same time, obtaining a synthetic quartz glass member.

As shown in FIG. 1, a quartz glass target 2 was attached to a rotating support 1. Argon gas 5 was introduced into methyltrimethoxysilane 4 in an evaporator 3 whereby the vapor of methyltrimethoxysilane 4 was entrained on the argon gas 5, which was, in turn, mixed with oxygen gas 6 to form a gas mixture, which was fed into a central nozzle of a quartz burner 7. Additionally, oxygen gas 8, hydrogen gas 9, hydrogen gas 10, and oxygen gas 11 were fed to the burner 7 concentrically around the gas mixture from the inside to the outside in the described order. From the burner 7, the methyltrimethoxysilane and an oxyhydrogen flame 12 were injected toward the target 2 to form silica fine particles 13. The silica fine particles 13 were deposited on the target 2 and fusion vitrified at the same time, obtaining a synthetic quartz glass ingot 14.

The balance of flow rates of the respective gases is shown in Table. 1.

The synthetic quartz glass ingot was sized 140 mm in diameter and 500 mm in length. The following treatment A was effected on this synthetic quartz glass ingot, with the results shown in Table 1.

Treatment A

The synthetic quartz glass ingot was heated at 1,750° C. in an argon gas atmosphere at −200 Torr and held for one hour, obtaining a shape of 250 mm in diameter and 157 mm in length. It was then heated to 1,150° C. in air and held for 100 hours, and slowly cooled down at a rate of less than 0.1° C./min to a temperature of 600° C.

Example 2

The procedure of Example 1 was repeated except that the following treatment B was effected instead of treatment A. The results are also shown in Table 1.

Treatment B

Support bars of quartz glass were attached to the synthetic quartz glass ingot at opposed ends whereby the ingot was secured by a chuck of a lathe. The synthetic quartz glass ingot was heated by a propane gas burner while the lathe was rotated whereby shearing force was applied to the softened portion of the synthetic quartz glass ingot. The operating temperature was about 2,000° C. Thereafter, the above treatment A was effected.

From the synthetic quartz glass members resulting from treatments A and B, sections sized 200 mm in diameter and 100 mm in length were cut out and examined by an interferometer Zygo Mark IV (by Zygo Corporation) to find no striae in three directions. They also had a refractive index amplitude of up to $1\times10^{-6}$ and a birefringence of up to 1 nm/cm (model ABR-10A, by Uniopto Co.).

Figure 2:
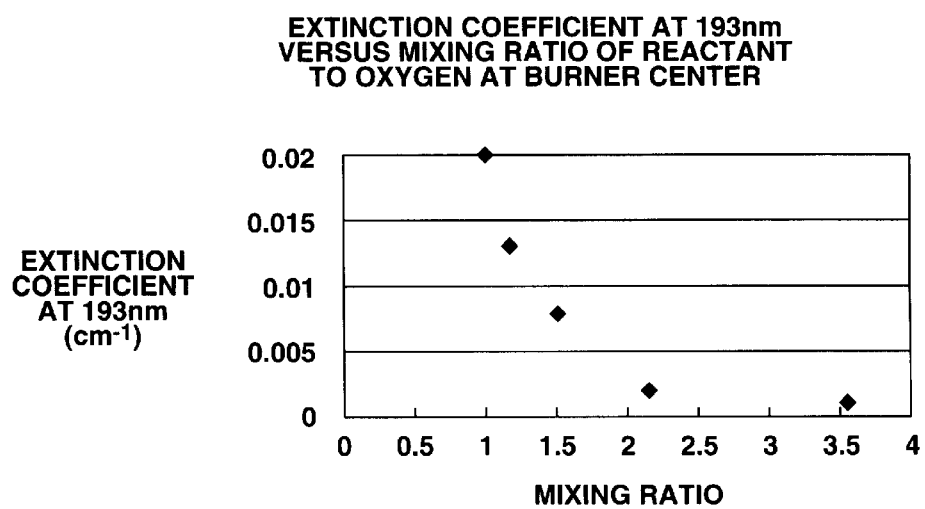
FIG. 2 is a graph showing the transmittance of quartz glass as a function of the mixing ratio of silane reactant to oxygen at the center of the burner.
Figure 3:
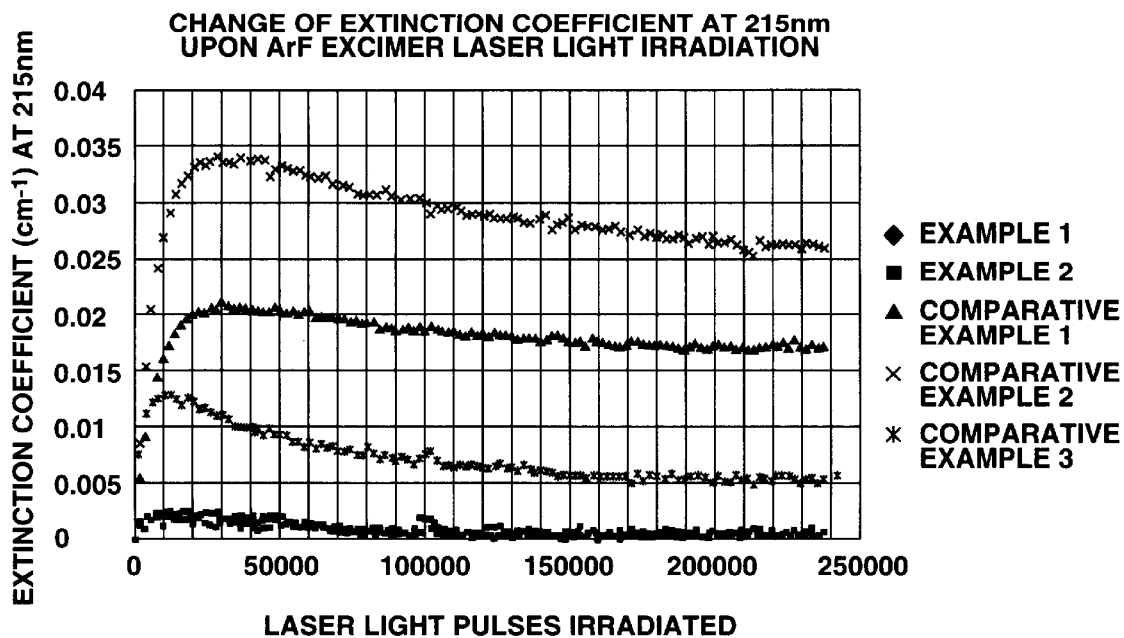
FIG. 3 is a graph showing how an extinction coefficient at 215 nm changes when ArF excimer laser light is irradiated.
Figure 4:
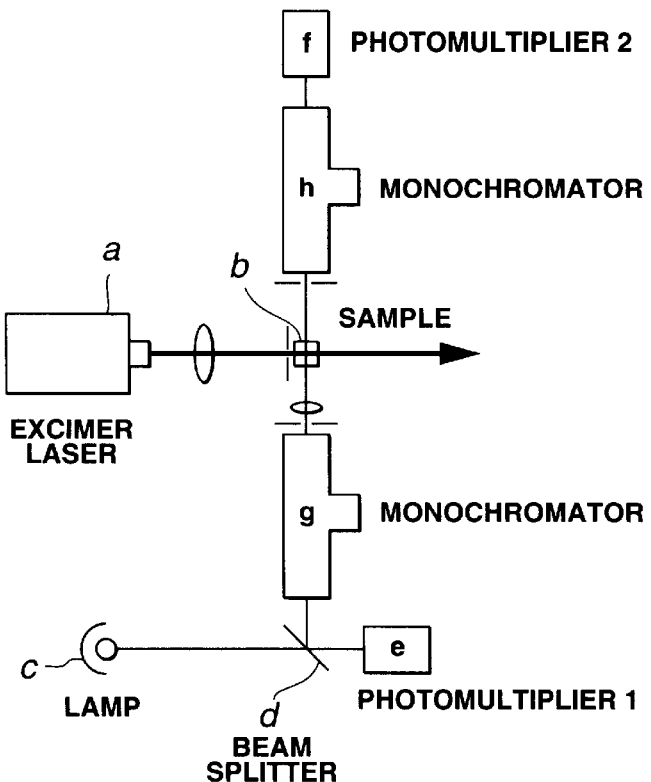
FIG. 4 is a block diagram illustrating an arrangement used for the measurement of an extinction coefficient at 215 nm.

For examining the formation of paramagnetic defects upon UV irradiation, a sample sized 10×10×40 mm was cut out and polished to a mirror finish. This glass sample was measured for initial transmittance at 193 nm (model Cary 400 by Varian Co.). An ArF excimer laser (model LPX-200, Lambda Physics Co.) was operated to irradiate light to the glass sample at 2 mJ/cm²/pulse, 200 Hz and $4\times10^4$ shots, and an extinction coefficient at wavelength 215 nm was measured. The measurement of an extinction coefficient at a wavelength of 215 nm was carried out by an arrangement as shown in FIG. 4. The extinction coefficient at 215 nm was calculated as $-\log Ti$ wherein Ti is an internal transmittance per centimeter. The internal transmittance is an apparent transmittance divided by a theoretical transmittance. It is now described how to measure a change of extinction coefficient. FIG. 4 is a schematic block diagram of a transmittance change measuring system wherein an excimer laser "a" in the form of LPX2000 by Lambda Physics Co. emits laser light to the surface of a sample "b" at right angles at an energy density of 150 mJ/cm²/pulse and 100 Hz. The transmittance measuring arrangement includes a D2 lamp "c" as a UV light source, a first monochromator "g" for isolating light of 215 nm, a first photomultiplier "e" for measuring the intensity of incident light through a beam splitter "d," a second monochromator "h" opposed to the first monochromator "g" with respect to the sample "b," and a second photomultiplier "f" for measuring the intensity of light transmitted thereby. The D2 lamp "c" emits light, a part of which reaches the photomultiplier "e" through the beam splitter "d" and the remaining part of which enters the monochromator "g" for isolating light of 215 nm which is received by the photomultiplier "f" through the sample "b" and the monochromator "h." A transmittance is determined from the ratio of light intensities received by the photomultipliers "e" and "f." Since the measurement of light intensities by the photomultipliers "e" and "f" is synchronized with the oscillating pulse of the excimer laser, the measurement of transmittance can be conducted simultaneously with laser irradiation. The results are shown in Table 1 and FIGS. 2 and 3.

Comparative Examples 1–3

The procedure of Example 1 was repeated under the conditions shown in Table 1. Comparative Examples 1 and 2 employed treatment B. Comparative Example 3 employed treatment A. The results are shown in Table 1.

TABLE 1

| | Reactant feed (g/hr) | Mixing oxygen flow rate (Nm³/hr) | Overall hydrogen flow rate (Nm³/hr) | Overall oxygen flow rate (Nm³/hr) | Ratio of reactant to oxygen at burner center | Hydrogen molecule content (molecules/cm³) | Initial transmittance at 193 nm (%) | Transmittance change at 193 nm (cm⁻¹) |
|---|---|---|---|---|---|---|---|---|
| Example 1 | 950 | 3.6 | 55 | 26 | 3.55 | $1.6 \times 10^{18}$ | 99.65 | 0.001 |
| Example 2 | 1400 | 3.2 | 50 | 22 | 2.15 | $3 \times 10^{18}$ | 99.68 | 0.002 |
| Comparative Example 1 | 1750 | 2.2 | 45 | 21 | 1.16 | $5 \times 10^{18}$ | 99.63 | 0.013 |
| Comparative Example 2 | 2000 | 2.1 | 50 | 18 | 1 | $5 \times 10^{18}$ | 99.67 | 0.020 |
| Comparative Example 3 | 1780 | 2.8 | 50 | 21 | 1.5 | $3 \times 10^{18}$ | 99.66 | 0.008 |

There has been described a synthetic quartz glass member for an excimer laser, which experiences a minimized change of light transmittance.

What is claimed is:

1. A synthetic quartz glass member for an excimer laser, having
   (i) a change of transmittance at wavelength 193 nm of up to 0.002 cm⁻¹ as expressed in extinction coefficient when $4\times10^4$ shots of ArF excimer laser light are irradiated at 2 mJ/cm²/pulse,
   (ii) an initial transmittance of at least 99.6% at 193 nm,
   (iii) a hydrogen molecule content of at least $5\times10^{17}$ molecules/cm³,
   (iv) a refractive index amplitude of up to $1\times10^{-6}$, and
   (v) a birefringence of up to 1 nm/cm.

2. The synthetic quartz glass member of claim 1 wherein the excimer laser is an ArF excimer laser.

3. A method for preparing a synthetic quartz glass member for an excimer laser as set forth in claim 1, comprising the step of:
   feeding a mixture of an organic silicon compound and oxygen into a central nozzle of a burner for effecting decomposition of the organic silicon compound with an oxyhydrogen flame to synthesize quartz glass, the mixing ratio of the organic silicon compound to oxygen being at least two fold moles of the theoretical amount of oxygen.

4. A method according to claim 3, wherein the organic silicon compound is a compound of formulae (1), (2) or (3)

(1)

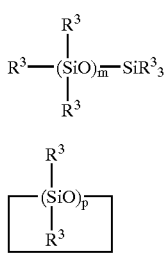

wherein
- $R^1$ and $R^2$, each independently, are a monovalent aliphatic hydrocarbon group,
- $R^3$ is hydrogen or a monovalent aliphatic hydrocarbon group,
- n is an integer of 0 to 3,
- m is an integer of at least 1, and
- p is an integer of 3 to 5.

5. A method according to claim 4, wherein m is 1 or 2.

6. A method according to claim 4, wherein monovalent aliphatic hydrocarbon is an alkyl group of 1 to 4 carbon atoms, a cycloalkyl group of 3 to 6 carbon atoms, or an alkenyl group of 2 to 4 carbon atoms.

7. A method according to claim 4, wherein the compound of formulae (1), (2) or (3) is $Si(OCH_3)_4$, $Si(OCH_2CH_3)_4$, $CH_3Si(OCH_3)_3$, hexamethyldisiloxane, hexamethylcyclotrisiloxane, octamethylcyclotetrasiloxane, or decamethylcyclopentasiloxane.

8. A method according to claim 3, wherein the mixing ratio of the organic silicon compound to oxygen is 2.5 to 4.0 fold moles of the theoretical amount of oxygen.

9. A method for preparing a synthetic quartz glass member for an excimer laser as set forth in claim 1, comprising the steps of:
feeding a mixture of an organic silicon compound and oxygen into a central nozzle of a burner for effecting decomposition of the organic silicon compound with an oxyhydrogen flame to synthesize quartz glass, the mixing ratio of the organic silicon compound to oxygen being at least two fold moles of the theoretical amount of oxygen, and annealing the resulting synthetic quartz glass member.

10. A method according to claim 9, wherein annealing is performed by heating the synthetic quartz glass member in an inert gas atmosphere to a temperature of at least 1,500° C. followed by heating at 1,100° C. to 1,250° C. and then cooling at a rate of 0.1° C./min or less down to a temperature of 600° C.

11. A method for preparing a synthetic quartz glass member for an excimer laser as set forth in claim 1, comprising the steps of:
feeding a mixture of an organic silicon compound and oxygen into a central nozzle of a burner for effecting decomposition of the organic silicon compound with an oxyhydrogen flame to synthesize quartz glass, the mixing ratio of the organic silicon compound to oxygen being at least two fold moles of the theoretical amount of oxygen, homogenizing the resulting synthetic quartz glass member, and annealing the synthetic quartz glass member.

12. A method according to claim 11, wherein homogenizing is performed by applying a shearing force to the synthetic quartz glass member at a temperature of at least 1600° C.

13. A synthetic quartz glass member according to claim 1, wherein the synthetic quartz glass member has a change of transmittance at wavelength 193 nm of up to 0.0015 $cm^{-1}$ as expressed in extinction coefficient when $4\times10^4$ shots of ArF excimer laser light are irradiated at 2 $mJ/cm^2$/pulse.

14. A synthetic quartz glass member according to claim 1, wherein the synthetic quartz glass member has an initial transmittance of at least 99.7% at 193 nm.

15. A synthetic quartz glass member according to claim 1, wherein the synthetic quartz glass member has a hydrogen molecule content of at least $10\times10^{17}$ molecules/$cm^3$.

16. A synthetic quartz glass member according to claim 1, wherein the synthetic quartz glass member has a hydrogen molecule content of up to about $1\times10^{19}$ molecules/$cm^3$.

17. A synthetic quartz glass member according to claim 1, wherein the synthetic quartz glass member has a refractive index amplitude of up to $0.5\times10^{-6}$.

18. A synthetic quartz glass member, having
(i) a change of transmittance at wavelength 193 nm of up to 0.002 $cm^{-1}$ as expressed in extinction coefficient when $4\times10^4$ shots of ArF excimer laser light are irradiated at 2 $mJ/cm^2$/pulse,
(ii) an initial transmittance of at least 99.6% at 193 nm,
(iii) a hydrogen molecule content of at least $5\times10^{17}$ molecules/$cm^3$,
(iv) a refractive index amplitude of up to $1\times10^{-6}$, and
(v) a birefringence of up to 1 nm/cm.

19. A substrate for a photomask comprising a synthetic quartz glass member according to claim 18.

20. A lens, a prizm, a mirror, a beam splitter or a window comprising a synthetic quartz glass member according to claim 18.

* * * * *